United States Patent [19]

Kobayashi et al.

[11] 4,362,680

[45] Dec. 7, 1982

[54] PROCESS FOR PRODUCTION OF MOLDED ARTICLES OF ACETYLENE POLYMER

[75] Inventors: Yukio Kobayashi; Masaaki Kira, both of Yokohama; Kinya Yamaguchi, Tokyo, all of Japan

[73] Assignee: Showa Denko K.K., Tokyo, Japan

[21] Appl. No.: 222,905

[22] Filed: Jan. 5, 1981

[30] Foreign Application Priority Data

| Mar. 21, 1980 [JP] | Japan | 55/34686 |
| Mar. 21, 1980 [JP] | Japan | 55/34687 |
| Mar. 21, 1980 [JP] | Japan | 55/34689 |
| Jun. 4, 1980 [JP] | Japan | 55/74401 |

[51] Int. Cl.$^3$ .......................... H01B 1/12; B29C 3/00
[52] U.S. Cl. .................... 264/83; 264/101; 264/104; 264/175; 264/289.3; 264/294; 264/343; 526/285
[58] Field of Search ............. 264/83, 101, 104, 289.3, 264/175, 343, 294; 526/285

[56] References Cited

U.S. PATENT DOCUMENTS

| 2,751,628 | 6/1956 | Carpenter et al. | 526/285 |
| 3,994,867 | 11/1976 | Baughman et al. | 526/285 |
| 4,255,535 | 3/1981 | Baughman et al. | 264/289.3 |

FOREIGN PATENT DOCUMENTS

| 48-32581 | 6/1973 | Japan . |
| 54-36283 | 3/1979 | Japan . |
| 54-36288 | 3/1979 | Japan . |
| 55-13769 | 1/1980 | Japan | 526/285 |
| WO80/02143 | 10/1980 | PCT Int'l. Appl. . |
| WO80/02146 | 10/1980 | PCT Int'l. Appl. . |

OTHER PUBLICATIONS

J.C.S. Chem. Comm., 662–663 (1979).
S. L. Hsu et al., J. Chem. Phys., 69 (1), 106–111 (1978).

Primary Examiner—Jeffery R. Thurlow
Attorney, Agent, or Firm—Wenderoth, Lind & Ponack

[57] ABSTRACT

A process for producing a molded article of a high polymer of acetylene, which comprises press-forming a gel-like material or swollen material composed of 5 to 95% by weight of a high polymer of acetylene having a cis content of at least 50% and 95 to 5% by weight of an organic solvent at a temperature of not more than 50° C. and a pressure of 10 to 1,000 kg/cm$^2$ with or without prior treatment with an electron acceptor or donor substance, and when the treatment with the electron acceptor or donor substance is not performed, calendering or monoaxially stretching the resulting molded article, and if a molded article of an especially high electrical conductivity is desired, treating the molded article further with an electron acceptor or donor substance.

8 Claims, No Drawings

PROCESS FOR PRODUCTION OF MOLDED ARTICLES OF ACETYLENE POLYMER

This invention relates to a process for producing a molded article of a high polymer of acetylene. The present invention also relates to a process for producing a molded article of a high polymer of acetylene which has a high electrical conductivity. The invention further pertains to a process for producing a molded article of a high polymer of acetylene which has electrical anisotropy. The molded articles of an acetylene polymer obtained by these processes are useful as organic semiconductors.

The high polymer of acetylene is referred to hereinbelow simply as an "acetylene polymer".

An acetylene polymer obtained by polymerizing acetylene in the presence of a Ziegler-Natta catalyst comprising a transition metal compound and an organometallic compound is known as an organic semiconductor useful as an electronics element. Molding methods normally used for thermoplastic resins, however, cannot be applied to the acetylene polymer because it does not melt under heat, and when heated in the presence of oxygen, it readily undergoes oxidative degradation. Moreover, no solvent has been found which can dissolve the acetylene polymer. Accordingly, the production of practical molded articles of the acetylene polymer has previously been limited to the following two methods.

(a) Press-forming of a powdery acetylene polymer.

(b) Production of a film-like or fibrous acetylene polymer by polymerizing acetylene on an interface between a catalyst solution and the free surface of the gaseous acetylene, or on a solid surface coated with the catalyst solution (Japanese Patent Publication No. 32581/73).

The method (a) has the defect that the resulting molded articles have low mechanical strength. The method (b) has the disadvantage that the resulting molded articles are in the form of a film or fibers having a small thickness, molded articles having a uniform thickness are difficult to obtain, and the mechanical strength of the molded articles is insufficient.

In view of this state of art, the present inventors previously suggested a process for producing a molded article of an acetylene polymer which has sufficient mechanical strength and a large and uniform thickness (Japanese patent application Nos. 36283/79 and 36288/79). According to this prior process, a gel-like material having a very low bulk density is subjected to press forming or roll molding in one step, and therefore, a high level of molding technique is required in order to obtain molded articles of uniform thickness. Frequently, the gel-like material is destroyed into small pieces, making it impossible to obtain molded articles of uniform thickness. Moreover, the mechanical strength of the resulting molded articles is not entirely satisfactory.

It has already been known to increase greatly the electrical conductivity of a film-like or fibrous acetylene polymer obtained by the method (b) by treating it with an electron acceptor or donor substance. For example, some of the inventors of the present application previously discovered that certain electron acceptor substances are effective for increasing the electrical conductivity of an acetylene polymer, and made some suggestions about these substances (Japanese patent application Nos. 36284/79, 36285/79, 36286/79, 36287/79, 49734/79 and 50245/79). However, when the film-like acetylene polymer obtained by the method (b) is treated with the electron acceptor or donor substance, its electrical conductivity achieved at room temperature is at most 1,200 ohm$^{-1}$·cm$^{-1}$ [J. C. S., Chem. Comm., 662 (1979)]. It has been desired therefore to develop an organic semiconductor having a higher electrical conductivity.

It has already been known, on the other hand, that a semiconductor having electrical anisotropy can be produced by monoaxially stretching the film-like or fibrous acetylene polymer obtained by the method (b). Since, however, the acetylene polymer obtained by the method (b) is in the form of a film or fiber having a small thickness, it is impossible to produce a monoaxially oriented acetylene polymer having a sufficiently large film thickness and electrical anisotropy.

It is an object of this invention therefore to provide a process for producing molded articles of an acetylene polymer which remedies the aforesaid defects of prior art techniques.

In accordance with this invention, the above object is achieved by a process for producing a molded article of an acetylene polymer, which comprises press-forming a gel-like or swollen material composed of 5 to 95% by weight of an acetylene polymer having a cis content of at least 50% and 95 to 5% by weight of an organic solvent at a temperature of not more than 50° C. and a pressure of 10 to 1000 kg/cm$^2$ with or without prior treatment with an electron acceptor or donor substance, and when it is not treated with the electron acceptor or donor substance, calendering or monoaxially stretching the resulting molded article, and if a molded article of an especially high electrical conductivity is desired, treating the molded article further with an electron acceptor or donor substance.

Thus, the process of this invention can easily afford molded articles of an acetylene polymer having high mechanical strength and a uniform thickness, and molded articles of an acetylene polymer which have high mechanical strength and a high electrical conductivity and are commercially useful as electronics elements, etc.

The "gel-like material", as used in this invention, denotes an assembly of fibrous microcrystals (fibrils) of an acetylene polymer which are uniformly dispersed in an organic solvent.

The "swollen material", as used in this invention, denotes fibrils of an acetylene polymer which are densely entangled to make up a certain configuration, with an organic solvent being held in the interstices among the fibrils.

The "swollen material" has a higher content of the acetylene polymer than the "gel-like material".

The gel-like material or swollen material of an acetylene polymer used in this invention can be produced, for example, by the following methods. Its production, however, is not limited to these methods.

(1) A method for producing a gel-like material of an acetylene polymer, which comprises polymerizing acetylene with stirring in the presence of a catalyst system composed mainly of a transition metal compound and an organometallic compound in an aromatic compound, an aliphatic compound, an alicyclic compound or an oxygen-containing heterocyclic compound as a solvent, the concentration of the transition metal compound being 0.0001 to 0.1 mole per liter of solvent (Japanese patent application Nos. 36283/79 and 54017/79).

(2) A method for producing a gel-like material of an acetylene polymer, which comprises adding the same catalyst system as used in method (1) to a solution of acetylene in a solvent, or adding a solution of acetylene in one component of the catalyst system to a solvent containing the other component of the catalyst system, and polymerizing acetylene (Japanese patent application No. 54018/79).

(3) A method for producing a swollen film-like acetylene polymer, which comprises polymerizing acetylene in a stationary polymerization system using a catalyst system comprising as a main component a transition metal compound alone or both the transition metal compound and an organometallic compound, the concentration of the transition metal compound being 0.001 to 0.1 mole per liter of solvent (Japanese patent application No. 17733/80).

(4) A method for producing a swollen acetylene polymer which comprises polymerizing acetylene in hexane as a solvent using a special transition metal compound, i.e. $\mu$-($\eta^1$:$\eta^5$-cyclopentadienyl)-tris($\eta$-cyclopentadienyl) dititanium (Ti-Ti)[(C$_5$H$_4$)$_5$(C$_5$H$_5$)$_3$Ti$_2$], as a catalyst [S. L. Hsu et. al., J. Chem. Phys., 69 (1), 106–111 (1978)].

There is no particular restriction on the solvent used in this invention. Usually, it may be an aliphatic or aromatic hydrocarbon, a halogenated hydrocarbon, an ether, a carboxylic acid ester, an acid anhydride, a ketone, an alicyclic compound, an oxygen-containing heterocyclic compound, etc. These organic solvents may also be used as a polymerization solvent for the production of an acetylene polymer. Alternatively, it is possible to polymerize acetylene using a solvent other than the above-exemplified solvents, and then substitute any one of the aforesaid organic solvents for a greater portion of the polymerization solvent contained in the resulting gel-like or swollen material of acetylene polymer.

Among the above organic solvents, the aromatic hydrocarbons and aromatic ethers are preferred. Typical examples include benzene, toluene, xylene, ethylbenzene, methylphenyl ether (anisole), ethylphenyl ether, diphenyl ether, n-dimethoxybenzene, p-dimethoxybenzene, p-diethoxybenzene, p-diethoxybenzene and 1,3,5-trimethoxybenzene.

The organic solvent may be a mixture of at least two of the above-exemplified solvents, or may be partly replaced by an aliphatic or aromatic alcohol or carboxylic acid.

After the polymerization of acetylene, a part of the polymerization solvent may be removed by a customary method, or the acetylene polymer may be washed with an organic solvent to remove the catalyst. It is essential however that until the acetylene polymer is submitted to press-forming, it should be maintained in the form of a gel-like or swollen material. Drying of the acetylene polymer before press-forming makes its molding difficult. Optionally, the acetylene polymer may be treated with an electron acceptor substance or an electron donor substance before press-forming (this will be described in detail hereinbelow). This treatment should be performed in the presence of an organic solvent to maintain the acetylene polymer in the form of a gel-like or swollen material.

The acetylene polymer that can be used in this invention has a cis content of at least 50%. If the cis content is less than 50%, the flexibility of the acetylene polymer is reduced and a uniform molded article is difficult to obtain. The cis content of the acetylene polymer can be controlled by the polymerization temperature or the catalyst-preparing conditions.

The amount of the acetylene polymer in the gel-like or swollen material used in this invention is from 5 to 95% by weight. If the proportion of the acetylene polymer in the gel-like or swollen material is less than 5% by weight, it is difficult to produce a molded article having a uniform thickness. If it exceeds 95% by weight, it is difficult to press-form the acetylene polymer.

The pressure employed at the time of press-forming is in the range of 10 to 1,000 kg/cm$^2$. If the pressure is less than 10 kg/cm$^2$, a molded article having sufficient mechanical strength is difficult to obtain, or cracking or breakage occurs in the subsequent calendering or monoaxial stretching step. On the other hand, when the pressure exceeds 1,000 kg/cm$^2$, the molded article is difficult to calender or monoaxially stretch, and it is difficult to obtain a product having sufficiently high mechanical strength.

Press-forming results in removal of a greater portion of the organic solvent from the acetylene polymer, but a small portion of it remains. It is not desirable to remove all of the remaining solvent at this stage because the subsequent calendering or monoaxial stretching becomes difficult.

The calendering is a molding technique using rolls which is practiced widely by those skilled in the art. It is performed preferably at a temperature of not more than 50° C. The clearance between the rolls and the pressure between them vary depending upon the thickness required of the molded article of acetylene polymer and the content of the acetylene polymer in the gel-like material or the swollen material. However, any one skilled in the art would be able to select them properly.

By pressing the molded gel-like material or swollen material composed of the acetylene polymer and the residual organic solvent between at least two calendering rolls, there can be obtained a sheet or film of acetylene polymer having a more uniform thickness than molded articles obtained by conventional methods. The pressure of the rolls is at least 1 kg/cm$^2$, preferably at least 5 kg/cm$^2$. If the pressure is less than 1 kg/cm$^2$, it is difficult to obtain a molded article having sufficiently high mechanical strength. During the calendering, a greater portion of the remaining organic solvent is removed from the acetylene polymer, but a small portion of it remains. The remaining organic solvent does not adversely affect the use of the resulting molded article, but may be removed by vacuum drying, etc.

According to the process of this invention, the press-formed product may be subjected to monoaxial stretching instead of the calendering. This monoaxial stretching results in an oriented molded article of acetylene polymer having electrical anisotropy, which is very useful industrially as various electronics elements.

The monoaxial stretching is carried out by stretching the sheet-like molded article containing the organic solvent by 50 to 200%, namely to 1.5 to 3 times, under a load lower than its break strength, preferably at a temperature of not more than 50° C. When it is desired to obtain a molded article stretched at a higher stretch ratio, the monoaxial stretching can also be achieved by heat-treating the molded article under a load in an atmosphere of an inert gas such as argon or nitrogen or in vacuum, preferably at a temperature in the range of 100° to 250° C. If the treating time is lower than 100° C., stretching at a higher ratio is difficult to perform. On the other hand, if it exceeds 250° C., decomposition of the acetylene polymer is liable to take place. The monoaxially stretched article may sometimes contain the residual organic solvent which may be removed by vacuum drying, etc.

In the process of this invention, the acetylene polymer may optionally be treated with an electron acceptor substance or an electron donor substance prior to the press-forming step. As stated hereinabove, it is known that treatment of a film-like or fibrous acetylene polymer with an electron acceptor or donor substance makes it possible to increase the electrical conductivity of the acetylene polymer. According to conventional treating methods of this type, the electrical conductivity of a thick molded article of acetylene polymer is difficult to increase uniformly because a difference in electrical conductivity arises between the surface and the interior of the molded article. The present inventors have found that this difficulty can be overcome by treating a gel-like or swollen acetylene polymer containing an organic solvent with an electron acceptor or donor substance and then molding the treated polymer. Thus, according to this invention, when it is necessary to increase uniformly the electrical conductivity of a molded article having a relatively large thickness, this treatment is carried out before the press-forming step. In the present application, the treatment of the acetylene polymer with the electron acceptor or donor substance is sometimes referred to as "doping".

Examples of the electron acceptor substance used in doping include halogens such as iodine, bromine and bromine iodine; metal halides such as arsenic pentafluoride, antimony pentafluoride, silicon tetrafluoride, phosphorus pentachloride, phosphorus pentafluoride, aluminum chloride, aluminum bromide, boron trifluoride, boron trichloride and boron tribromide; protonic acids such as sulfuric acid, nitric acid, fluorosulfuric acid, perchloric acid, chlorosulfuric acid and trifluoromethanesulfonic acid; peroxides such as peroxy disulfuryl difluoride; anhydrides of acids such as sulfur trioxide and nitrogen dioxide; and electron-accepting organic compounds such as tetracycloethylene, tetracyanoquinodimethane, chloranil and bromanil. These examples are not limitative. Examples of the electron donor substance include sodium, potassium and cesium. These examples are not limitative, either.

Various procedures may be used to treat the gel-like or swollen acetylene polymer with an electron acceptor or donor substance depending upon the type of the electron acceptor or donor substance. They include, for example, direct contacting of the acetylene polymer with arsenic pentafluoride, gaseous iodine, etc., direct contacting of the polymer with a liquid such as sulfuric acid or trifluoromethanesulfonic acid, direct contacting of the polymer with a solid such as aluminum trichloride or aluminum bromide, and treatment of the polymer with a solution of the electron donor or acceptor substance in a suitable solvent.

The sufficient amount of the electron acceptor or donor substance to be used to dope the acetylene polymer is up to 0.5 mole per mole of carbon in the acetylene polymer.

The temperature at which the gel-like or swollen acetylene polymer is contacted with the electron acceptor or donor substance differs depending upon the type of the electron acceptor or donor substance. Usually, the temperature is preferably not more than 100° C.

The contacting time differs depending upon the type and amount of the electron acceptor or donor substance and the electrical conductivity required of the acetylene polymer.

The acetylene polymer having a high electrical conductivity obtained by treatment with the electron acceptor or donor substance is a gel-like or swollen material containing the organic solvent. A molded article having a desired thickness can be easily obtained from the treated gel-like or swollen material by press-forming it and optionally calendering or monoaxially stretching it.

In another embodiment of this invention, the product obtained by the above-described steps of press-forming the gel-like or swollen material consisting of an acetylene polymer and an organic solvent with or without prior treatment with an electron acceptor or donor substance and then calendering or monoaxially stretching the molded article may be treated further with an electron acceptor or donor substance. By doping the molded article with the electron acceptor or donor substance in this way, its electrical conductivity can be increased to a desired higher value.

This doping with the electron acceptor or donor substance can be performed in substantially the same way as in the doping performed prior to the press-forming step. Specifically, the electron acceptor or donor substance may be the same as those exemplified hereinabove, and the treating method may be the same as those described hereinabove. Furthermore, known methods described in the literature may be employed. For example, when sulfuric acid is used as the electron acceptor substance, there can be used (1) a method which comprises dipping the acetylene polymer directly in sulfuric acid, (2) a method which comprises placing sulfuric acid in an organic or inorganic solvent which does not react with it, dipping the acetylene polymer in the solvent, and treating the polymer with the sulfuric acid diffused in the solvent, or (3) a method which comprises placing the acetylene polymer in vacuum or in an inert gas, and treating the polymer with a vapor of sulfuric acid.

The preferred treating temperature differs depending upon the type of the electron acceptor or donor substance and the method of treatment. Generally, it is from $-100°$ C. to 100° C., preferably from $-80°$ C. to 80° C. The amount of the electron acceptor or donor substance to be used to dope the acetylene polymer is up to 0.5 mole per mole of the acetylene unit in the acetylene polymer.

Thus, the electrical conductivity of the molded article of acetylene polymer can be freely controlled over a broad range of from $10^{-8}$ to $3 \times 10^3$ ohm$^{-1}\cdot$cm$^{-1}$.

According to the process of this invention described hereinabove, a molded article of an acetylene polymer having a uniform thickness, high mechanical strength and a high electrical conductivity can be obtained, and the desired thickness and electrical conductivity can be controlled within broad ranges.

The resulting molded article of acetylene polymer having a high electrical conductivity is a P-type or N-type semiconductor, and can be directly used as an organic semiconductor useful as an electronics or electrical element. In combination with an N-type or P-type semiconductor, it can be easily formed into a P-N heterojunction element.

The acetylene polymer has a band gap energy of about 1.6 eV, and exhibits light conduction under visible light. The molded article of this invention is therefore useful also as various light-electric energy converter elements.

The monoaxially stretched molded article of acetylene polymer in accordance with this invention is very useful industrially as semiconductors having electric anisotropy and high mechanical strength in various electronics elements.

The following Examples further illustrate the present invention.

EXAMPLE 1

A 1-liter glass reactor completely purged with nitrogen gas was charged with 200 ml of toluene purified in a customary manner as a solvent and 2.94 millimoles of tetrabutoxytitanium and 7.34 millimoles of triethyl aluminum as a catalyst in this order at room temperature to prepare a catalyst solution. The catalyst solution was a uniform solution. The reactor was cooled with liquid nitrogen, and the nitrogen gas in the system was discharged by a vacuum pump. The reactor was cooled to $-78°$ C., and while keeping it stationary, purified acetylene gas under a pressure of 1 atmosphere was blown into the reactor.

The acetylene was polymerized for 4 hours while maintaining the pressure of the acetylene gas at 1 atmosphere. After the polymerization, the unreacted acetylene gas was removed. The product was washed four times with 200 ml of purified toluene while maintaining the temperature of the system at $-78°$ C. After washing, the solution assumed a slightly brown color, and the catalyst was not removed completely. The gel-like acetylene polymer swollen in toluene was in the form of a uniform film containing entangled fibrils. A powdery or lumpy polymer did not form.

The film-like gel-like material (containing 37% by weight of the acetylene polymer) was held between chromeplated ferro plates at room temperature. The pressure between them was raised gradually, and the gel-like material was press-formed at a pressure of 100 kg/cm$^2$ while removing toluene. Thus, a flexible tough sheet-like article having a thickness of 1.2 mm was obtained. The amount of the residual toluene in the article was 13% by weight.

The molded article was calendered by passing it through two rolls (roll temperature: room temperature; roll clearance 0.1 mm: roll diameter 3 inches; having a chrome-plated surface) to obtain a uniform sheet of acetylene polymer having a thickness of 0.12 mm. In the resulting sheet, about 1% by weight of toluene still remained. The remaining toluene was removed by vacuum drying at room temperature.

The resulting product was a P-type semiconductor having a cis content of 94% and an electrical conductivity (measured by a direct current four-probe method; the same method was used in the following Examples) of $2.1 \times 10^{-7} \times$ ohm$^{-1}$·cm$^{-1}$. The acetylene polymer sheet had a tensile strength (test specimen JIS No. 2½; the tensile speed 5 mm/min.) of 1520 kg/cm$^2$.

COMPARATIVE Example 1

The sheet-like molded article obtained by press-forming in Example 1 was vacuum dried without calendering. The product was subjected to a tensile test under the same conditions as in Example 1. Its tensile strength was found to be 415 kg/cm$^2$.

COMPARATIVE EXAMPLE 2

The gel-like acetylene polymer obtained in Example 1 was not press-formed but vacuum dried at room temperature to reduce the content of toluene in the acetylene polymer to 21% by weight. Then, the polymer was calendered by rolls in the same way as in Example 1 to obtain an acetylene polymer sheet having a uniform thickness of 0.21 mm. The sheet was vacuum dried and then subjected to a tensile test under the same conditions as in Example 1. Its tensile strength was found to be 747 kg/cm$^2$.

EXAMPLE 2

The film-like gel-like material obtained in Example 1 was cacuum dried at room temperature to increase the content of acetylene polymer to 62% by weight. The polymer was then press-formed and calendered in the same way as in Example 1 to obtain an acetylene polymer sheet having a thickness of 0.14 mm. The sheet was vacuum dried, and then subjected to a tensile test. Its tensile strength was found to be 1,770 kg/cm$^2$.

EXAMPLE 3

The sheet-like molded article containing 13% by weight of toluene which was obtained in Example 1 was vacuum dried at room temperature to reduce the content of the residual toluene to 5% by weight. The molded article was then calendered in the same way as in Example 1 to afford a uniform acetylene polymer sheet having a thickness of 0.11 mm. The sheet was vacuum dried at room temperature, and subjected to a tensile test. Its tensile strength was found to be 1,650 kg/cm$^2$.

EXAMPLE 4

The same catalyst solution as in Example 1 was prepared in a reactor by the same method as in Example 1, and the nitrogen gas in the reactor was discharged. The reactor was cooled to $-78°$ C., and while stirring the catalyst solution by a magnetic stirrer, a purified acetylene gas under a pressure of 1 atmosphere was blown into the reactor. In the initial stage of the polymerization reaction, the entire system became gelatin-like so that it was difficult to stir.

The stirring was stopped, and while maintaining the pressure of the acetylene gas at 1 atmosphere, the polymerization was continued for 24 hours. The polymerization system became gelatin-like with a reddish violet color. After the polymerization, the unreacted acetylene gas was removed. While maintaining the temperature of the system at $-78°$ C., it was washed four times with 200 ml of purified toluene. After the washing, the solution assumed a slightly brown color, and the catalyst was not completely removed. The gel-like acetylene polymer swollen in toluene was in the form of chips in which fibrils were entangled and uniformly dispersed. No powdery or lumpy polymer formed.

A part of the uniform gel-like material was taken out and dried, and the amount of the acetylene polymer in the gel-like material was measured. It was found that the gel-like material contained 10% by weight of the acetylene polymer.

The acetylene polymer had a cis content of 97% and an electrical conductivity at 20° C. of $4.8 \times 10^{-8}$ ohm$^{-1}$·cm$^{-1}$.

Thirty grams of the gel-like material and 25 g of iodine were put into a flask in an atmosphere of nitrogen, and allowed to stand for 48 hours. At the end of the 48-hour period, the gel-like material was taken out. It was held between chrome-plated ferro plates, and pressed at room temperature under a pressure of 400 kg/cm$^2$ to form a sheet-like molded article.

The sheet was vacuum dried at room temperature for 10 hours to remove the unreacted iodine and the remaining toluene.

The resulting acetylene polymer sheet was a P-type semiconductor having an electrical conductivity at 20° C. of 118 ohm$^{-1}$·cm$^{-1}$. The electrical conductivity of the entire sheet increased uniformly.

EXAMPLE 5

Thirty grams of the gel-like material obtained in Example 4 was doped in the same way as in Example 4 using 10 g of trifluoromethanesulfonic acid instead of 25 g of iodine. The product was worked up in the same way as in Example 4. The resulting sheet was a P-type semiconductor having an electrical conductivity of 305 ohm$^{-1}$·cm$^{-1}$. The electrical conductivity of the entire sheet increased uniformly.

EXAMPLE 6

A one-liter glass reactor purged completely with nitrogen gas was charged with 100 ml of toluene purified in a customary manner as a solvent and 2.94 millimoles of tetrabutoxytitanium and 7.34 millimoles of triethyl aluminum as a catalyst successively at room temperature to prepare a catalyst solution. The catalyst solution was a uniform solution. The reactor was cooled with liquid nitrogen, and the nitrogen gas in the system was discharged by a vacuum pump. The reactor was cooled to −78° C., and while keeping it stationary, purified acetylene gas under a pressure of 1 atmosphere was blown into the reactor.

While maintaining the acetylene gas pressure at 1 atmosphere and keeping the polymerization system stationary, the polymerization was performed for 4 hours. After the polymerization, the unreacted acetylene gas was removed. While maintaining the temperature of the system at −78° C., the polymerization product was washed four times with 200 ml of purified toluene to obtain a uniform film-like swollen material of an acetylene polymer swollen with toluene, in which fibrils were densely entangled. The swollen material contained 15% by weight of the acetylene polymer having a cis content of 94%.

The swollen material was treated with iodine in the same way as in Example 4, and then press-formed at room temperature under a pressure of 750 kg/cm$^2$ between chrome-plated ferro plates to form a sheet-like molded article having a thickness of 1.2 mm.

The sheet was vacuum dried under the same conditions as in Example 4. The resulting sheet was a P-type semiconductor having an electrical conductivity of 250 ohm$^{-1}$·cm$^{-1}$. The electrical conductivity of the entire sheet increased uniformly.

EXAMPLE 7

The acetylene polymer sheet obtained in Example 1 was dipped for 5 seconds in sulfuric acid (H$_2$SO$_4$ content 97%, for precision analysis; a product of Wako Pure Chemicals Co., Ltd.), and immediately withdrawn. It was deaerated and its electrical conductivity was measured 2 hours water. The product was found to be a P-type semiconductor having an electrical conductivity at 20° C. of 3,250 ohm$^{-1}$·cm$^{-1}$.

EXAMPLE 8

The same sulfuric acid as used in Example 7 was put into a glass vessel, and air therein was removed by a vacuum pump. The acetylene polymer sheet obtained in Example 1 was suspended in the gaseous phase portion of the vessel, and treated with a vapor of sulfuric acid at room temperature for 24 hours.

By this treatment, the acetylene polymer sheet showed a weight increase of 12%. The product was a P-type semiconductor having an electrical conductivity of 2,990 ohm$^{-1}$·cm$^{-1}$.

EXAMPLE 9

The acetylene polymer sheet obtained in Example 1 was put into a flask, and air was discharged by a vacuum pump. The sheet was treated for 12 hours with iodine gas introduced under the vapor pressure at room temperature of iodine. Then, the unreacted iodine was discharged by a vacuum pump.

The product was a P-type semiconductor having an electrical conductivity at 20°C. of 1,400 ohm$^{-1}$·cm$^{-1}$.

COMPARATIVE EXAMPLE 3

In a 500 ml glass reactor under a nitrogen atmosphere, 5.1 ml (15.0 millimoles) of titanium tetrabutoxide was dissolved in 20.0 ml of toluene, and then 5.4 ml (40 millimoles) of triethyl aluminum was added with stirring and reacted to prepare a catalyst solution.

The reactor was cooled with liquid nitrogen, and the nitrogen gas in the system was discharged by a vacuum pump. Then, the reactor was cooled to −78° C.

The reactor was rotated to cause the catalyst solution to adhere uniformly to the inside wall of the reactor. While the reactor was kept stationary, purified acetylene gas under a pressure of 1 atmosphere was introduced and its polymerization was started. As soon as the polymerization was started, an acetylene polymer having a metallic luster deposited on the inner wall of the reactor. At a temperature of −78° C., the acetylene was polymerized for 1 hour while maintaining its pressure at 1 atmosphere. Then, the unreacted acetylene was discharged by a vacuum pump to stop the polymerization. The remaining catalyst solution was removed by a syringe under an atmosphere of nitrogen. While maintaining the temperature at −78° C., the product was washed six times with 100 ml of purified toluene, and then vacuum dried at room temperature.

At that part of the reactor to which the catalyst solution adhered, a film-like acetylene polymer having the same area as that part, a thickness of 90 micrometers and a cis content of 98% was obtained. The film-like acetylene polymer had an electrical conductivity at 20° C. of 2.5×10$^{-8}$ ohm$^{-1}$·cm$^{-1}$.

The film-like acetylene polymer was dipped in sulfuric acid (H$_2$SO$_4$ content 97%, for precision analysis; a product of Wako Pure Chemicals, Co., Ltd.) for 5 seconds, and immediately then withdrawn. It was deaerated, and 2 hours later, its electrical conductivity was measured. The product was found to be a P-type semiconductor having an electrical conductivity of at 20° C. of 530 ohm$^{-1}$·cm$^{-1}$ and a tensile strength of 210 kg/cm$^2$.

COMPARATIVE EXAMPLE 4

A gel-like acetylene polymer swollen in toluene was prepared by the same polymerization method as described in Example 4.

The gel-like acetylene polymer was put into a rectangular frame having a thickness of 10 mm, a length of 100 mm and a width of 50 mm, and press-formed between chromeplated ferro plates under a pressure of 100 kg/cm$^2$ at room temperature while removing toluene. Thus, a flexible tough sheet having a thickness of 5 mm was obtained. The sheet was a P-type semiconductor having an electrical conductivity at 20° C. of $5\times10^{-8}$ ohm$^{-1}$·cm$^{-1}$ and a tensile strength of 380 kg/cm$^2$.

The sheet-like molded article was put into a flask, and the air inside the flask was evacuated by a vacuum pump. Iodine gas was introduced into the flask at the vapor pressure at room temperature of iodine to treat the sheet with the iodine gas for 12 hours. After the treatment, the unreacted iodine was discharged by a vacuum pump. The treated sheet was a P-type semiconductor having an electrical conductivity at 20° C. of 95 ohm$^{-1}$·cm$^{-1}$.

COMPARATIVE EXAMPLE 5

A gel-like acetylene polymer swollen in toluene was prepared in the same way as in Example 4.

The gel-like acetylene polymer was vacuum dried to remove part of the remaining toluene and increase the content of the acetylene polymer to 50% by weight. The concentrated polymer was calendered by passing it through two rolls (roll temperature: room temperature; roll clearance 0.4 mm; roll diameter: 3 inches; having a chrome-plated surface) at room temperature to obtain a uniform acetylene polymer sheet having a thickness of 0.5 mm. The resulting sheet still contained about 1% by weight of toluene. Hence, it was vacuum dried at room temperature to remove the remaining toluene.

The dried acetylene polymer sheet was a P-type semiconductor having a cis content of 95%, an electrical conductivity of $2.5\times10^{-7}$ ohm$^{-1}$·cm$^{-1}$, and a tensile strength of 390 kg/cm$^2$.

The sheet was put into a flask, and the air inside the flask was evacuated by a vacuum pump. Iodine gas was introduced into the flask at the vapor pressure at room temperature of iodine to treat it with iodine for 12 hours. After the treatment, the unreacted iodine was removed by a vacuum pump. The treated sheet was a P-type semiconductor having an electrical conductivity at 20° C. of 103 ohm$^{-1}$·cm$^{-1}$.

EXAMPLE 10

The acetylene polymer sheet having a cis content of 94% which was obtained in Example 1 was heat-treated in vacuum at 200° C. for 2 hours to afford an acetylene polymer sheet having a trans content of 92% and a tensile strength of 950 kg/cm$^2$.

The acetylene polymer sheet was treated for 30 minutes with a vapor of sodium generated by heating metallic sodium at 230° C. The resulting acetylene polymer sheet was an N-type semiconductor having an electrical conductivity of 150 ohm$^{-1}$·cm$^{-1}$.

COMPARATIVE EXAMPLE 6

The film-like acetylene polymer having a cis content of 98% which was obtained in Comparative Example 3 was heat-treated in vacuum at 200° C. for 2 hours to afford a film-like acetylene polymer having a trans content of 93%.

The acetylene polymer was then treated with a vapor of metallic sodium in the same way as in Example 10. The resulting film-like acetylene polymer was an N-type semiconductor having an electrical conductivity of 30 ohm$^{-1}$·cm$^{-1}$.

EXAMPLE 11

An acetylene polymer swollen with toluene was prepared by the same polymerization method as described in Example 1. The polymer was a uniform film-like swollen material in which the fibrils were entangled densely. This film-like swollen material contained 15% by weight of an acetylene polymer having a cis content of 94%.

The film-like swollen material was press-formed between chrome-plated ferro plates at a pressure of 250 kg/cm$^2$ to form a flexible sheet-like molded article having a thickness of 1.5 mm. The amount of the remaining toluene in the sheet-like molded article was 21% by weight.

A specimen, 5 mm wide, was cut out from the sheet-like molded article, and monoaxially stretched by a tensile tester (interchuck distance 2.5 cm; load 25 kg/cm$^2$) to form a monoaxially stretched sheet-like molded article with a stretch ratio of 120%. The sheet-like article was vacuum dried at room temperature to remove the remaining toluene.

The monoaxially oriented sheet-like article had a cis content of 92%. Its electrical resistance was anisotropic. The specific resistance of the molded article at 23° C. was $2.02\times10^6$ ohm·cm in the stretching direction and $1.28\times10^7$ ohm·cm in a direction perpendicular to the stretching direction, and a tensile strength of 1,530 kg/cm$^2$.

The monoaxially oriented molded article was put into a flask, and the air inside the flask was evacuated by a vacuum pump. Iodine gas was introduced into the flask at the vapor pressure at room temperature of iodine to treat the molded article with iodine for 10 hours. After the treatment, the unreacted iodine was removed by a vacuum pump. The treated molded article had an electrical conductivity of 580 ohm$^{-1}$·cm$^{-1}$ (specific resistance $1.7\times10^{-3}$ ohm·cm) in the stretching direction and 91 ohm$^{-1}$·cm$^{-1}$ (specific resistance $1.1\times10^{-2}$ ohm·cm) in a direction perpendicular to the stretching direction.

COMPARATIVE EXAMPLE 7

The sheet-like molded article containing 21% by weight of the remaining toluene which was obtained in Example 11 was vacuum dried. The product had a specific electrical resistance of $1.02\times10^7$ ohm·cm and showed no anisotropy in specific resistance.

COMPARATIVE EXAMPLE 8

A swollen acetylene polymer having a cis content of 33% obtained in the same way as in Example 11 except that the polymerization temperature was changed to 80° C. was press-formed in the same way as in Example 11 to afford a sheet-like molded article containing 22% by weight of the remaining toluene.

A specimen, 5 mm wide, was cut out from the molded article in the same way as in Example 11, and monoaxially stretched by a tensile tester. The stretch ratio of the sample specimen was only 40%. The resulting monoaxially oriented article had a specific electrical resistance of $3.8\times10^7$ ohm·cm in the stretching direction and $1.35\times10^7$ ohm·cm in a direction perpendicular to the stretching direction, showing a low degree of electrical anisotropy.

What is claimed is:

1. A process for producing a molded article of a high polymer of acetylene having a high electrical conductivity, which comprises treating a gel-like material or swollen material composed of 5 to 95% by weight of a high polymer of acetylene having a cis content of at least 50% and a fibrous microcrystal structure and 95 to 5% by weight of an organic solvent with an electron acceptor or donor substance, and thereafter press-forming said treated material at a temperature of not more then 50° C. and a pressure of 10 to 1,000 kg/cm$^2$.

2. A process for producing a molded article of a high polymer of acetylene, which comprises press-forming a gel-like material or swollen material composed of 5 to 95% by weight of a high polymer of acetylene having a cis content of at least 50% and a fibrous microcrystal structure and 95 to 5% by weight of an organic solvent at a temperature of not more than 50° C. and a pressure of 10 to 1,000 kg/cm$^2$, and thereafter calendering or monoaxially stretching the resulting molded article.

3. A process for producing a molded article of a high polymer of acetylene having a high electrical conductivity, which comprises press-forming a gel-like material or swollen material composed of 5 to 95% by weight of a high polymer of acetylene having a cis content of at least 50% and a fibrous microcrystal structure and 95 to 5% by weight of an organic solvent at a temperature of not more than 50° C. and a pressure of 10 to 1,000 kg/cm$^2$, thereafter calendering or monoaxially stretching the resulting molded article and thereafter treating the molded article further with an electron acceptor or donor substance.

4. The process of claim 2 or 3 wherein the press-formed article is calendered while the organic solvent still remains in the press-formed article of the acetylene polymer.

5. The process of claim 4 wherein said calendering is carried out at a temperature of not more than 50° C.

6. The process of claim 2 or 3 wherein the press-formed article is monoaxially stretched while the organic solvent still remains in the press-formed article of the acetylene polymer.

7. The process of claim 6 wherein the monoaxial stretching is carried out a temperature of not more than 50° C.

8. The process of claim 6 wherein the monoaxial stretching is carried out in an inert gas atmosphere or in vacuum at a temperature of 100° to 250° C.

* * * * *